June 20, 1967 W. E. BARRE ET AL 3,327,174

COMPONENT ASSEMBLY HOLDER WITH READILY ACCESSIBLE TERMINALS INCORPORATED THEREIN

Filed Oct. 27, 1964

INVENTORS
WADE E. BARRE &
GLENN A. CULBERTSON
BY
Robert E. Strauser
ATTORNEY

United States Patent Office 3,327,174
Patented June 20, 1967

3,327,174

COMPONENT ASSEMBLY HOLDER WITH READILY ACCESSIBLE TERMINALS INCORPORATED THEREIN

Wade E. Barre and Glenn A. Culbertson, Warren, Pa., assignors to Sylvania Electric Products Inc., a corporation of Delaware Filed Oct. 27, 1964, Ser. No. 406,740
2 Claims. (Cl. 317—101)

This invention relates to an electronic component assembly device and more particularly to a package of a segment of integrated circuitry adapted for facile installation and replacement in an electrical circuit.

In the varied and intricate electronic circuitry characteristic of computers and similar complex control apparatus there is frequent need to replace vulnerable segments of the numerous circuits to insure efficiency of the operational whole. Componental parts frequently in need of replacement include, for example, electron tubes, semiconductor devices, capacitors, resistive elements, and circuit segments closely associated therewith. In addition, there are occasions when modifications of circuitry are expedient.

One means of accomplishing circuit modifications or the replacement of defective parts involves the individual removal of components and wire-wrapping, soldering, clamping, or otherwise bonding replacement items in the proper circuit relationships. This is a tedious, time consuming, and costly procedure both from initial installation and replacement considerations. Furthermore, to conveniently effect the initial installation of individual parts into a circuit complex and to accomplish subsequent circuit modifications or the replacement of like defective items necessitates a considerable amount of working space which defeats the conventional need for unitary compaction.

To facilitate rapid changes in selected circuitry or the replacement of associated components, a variety of modular unitized constructions have been devised for circuit applications utilizing plug-in type junction connections. Likewise a multiplicity of differing modular units are utilized in complex applications wherein the circuit requirements dictate the integration of certain componental combinations. The construction of packaged circuit assemblies to fulfill the numerous requirements has highlighted certain aggravative disadvantages and problems, occurring either singly or in combination. For example, these aggravations are manifest in certain constructions by high costs of fabrication, some componental integrations lack the condensed dimensions required for compact circuit requirements, others are difficult to install and replace, some lack provisions for adequate ventilation, and still others are deficient in insulative and dimensional stability in the presence of environmental pressure and heat.

Accordingly, it is an object of the invention to reduce the aforementioned disadvantages and to provide an improved electronic component assembly package formed for facile installation and replacement in circuit applications.

Another object is the provision of a compact package of integrated electronic circuitry wherein the contained components are protected during installation and replacement of the package.

A further object is to provide an assembly package having both insulative and dimensional stability in which the parts and circuitry insulatively contained therein provide added rigidity to the assembly structure.

Still another object is to provide a relatively inexpensive and expeditiously fabricated circuit assembly package wherein the components are spacedly oriented to facilitate adequate ventilation therebetween.

The foregoing objects are achieved in one aspect of the invention by the provision of a plastic component-containing package molded in the form of an open frame-like assembly of substantially rectangular outline having sufficient depth of frame to insulatively encase, in portions thereof, at least part of the integrated circuitry of the device. The assembly construction comprises a base portion having a plurality of spaced recesses with individual connective means spacedly positioned therein, an oppositely disposed head portion with circuitry connective means incorporated therein and a plurality of lateral support members joining the base and head portions into a strengthened integral unit. Thus, there is formed a rigid frame-like structure bounding at least one spatial opening wherein at least one electronic component is oriented and connectively joined to at least one of the individual connective means and to at least one of the circuitry connective means. In addition, the spatial opening also facilitates ventilation for the components comprising the assembly. The frame, in addition to insulatively encasing connective portions of the package circuitry, has sufficient depth to provide protection for the components oriented within the spatial opening when the assembly package is connectively inserted or removed from its functional position.

For a better understanding of the present invention, together with other and further objects, advantages, and capabilities thereof, reference is made to the following disclosure and appended claims in connection with the accompanying drawings in which:

Figure 1:
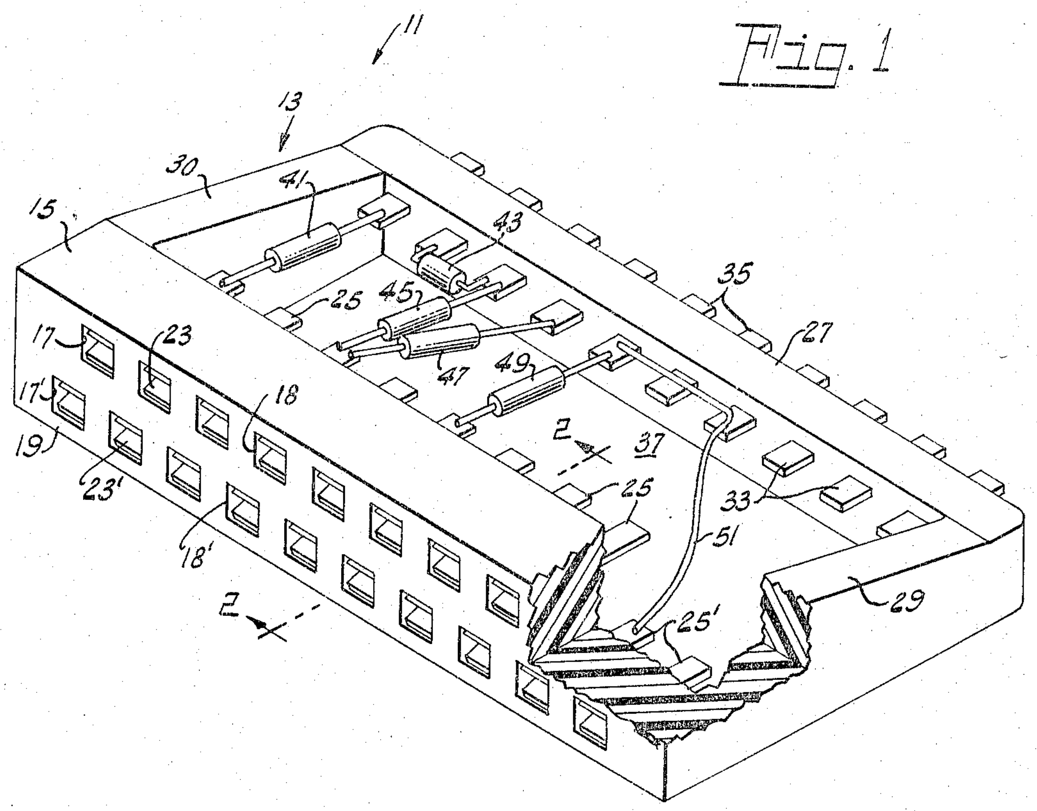
FIGURE 1 is a perspective view of one embodiment of the invention with a partially cut-away section to show connective means.

With reference to FIGURE 1, there is shown a component assembly package 11 having a plastic frame-like assembly holder 13 whereof the substantially longitudinal base portion 15 has formed therein a plurality of recesses substantially arranged as first row recesses 17 and second row recesses 17' all of which open on a juncture surface 19 thereof. While these recesses are shown as a plurality of identically dimensioned like recesses located substantially in rows, they may be otherwise positioned and spaced according to requirements. Individually oriented in these like recesses 17 and 17' are electrical contact members 23 and 23' formed to facilitate connections with external circuitry and having protruding connection tails 25 and 25', respectively. These contact members and connection tails are of like construction and are so designated to aid clarification of component connections. Oppositely disposed is a substantially longitudinal head portion 27 insulatively encasing a number of individual electrical connectors 31 therein having connective tabs 33 and conductive tongues 35 protruding therefrom. The connective tabs 33 are substantially disposed in opposite spaced relationship to individual connection tails 25 and 25' of contact members 23 and 23', respectively. Several componental parts 41, 43, 45, 47, 49 and common connector 51 are shown for purposes of illustration; components 41, 45, 47, and 49 being electrically joined to several connective tabs 33 and suitable connection tails 25; and common bus connector 51 forming a bridge between a plurality of tabs 33 and a connection tail 25'. Structurally joining the related base 15 and head 27 portions to complete the frame-like assembly holder 12 are two lateral support members: first end support member 29 and second end support member 30. Although not shown, longer assemblies may include one or more spaced intermediate supports to impart rigidity to the structure.

In greater detail, the component assembly package 11 is of a high impact strength nonconductive plastic, for example, a polycarbonate resin such as that manufactured by General Electric Company, Pittsfield, Mass., under the trade name of "Lexan." Polycarbonate resin has been found to have the inherent characteristics required for this specific application. In addition to being impact and heat resistant, it has rigidity, dimensional stability, desired electrical properties, ease of fabrication and stable colorability. This last mentioned item of stable colorability is of importance as similar assembly holders can be molded of different colored materials for a number of varied circuit applications. In this manner a specifically colored holder identifies the package as containing certain components connected in a special integrated manner for use in definite circuitry.

Figures 2, 3:
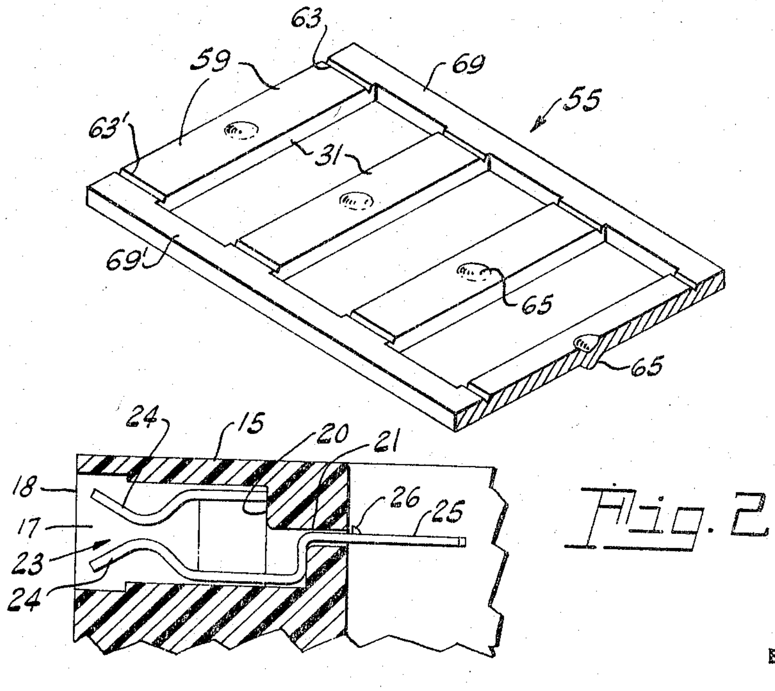
FIGURE 2 is a section of the base portion taken along lines 2—2 of FIGURE 1 illustrating one type of connective means.
FIGURE 3 is a perspective view showing means for effecting spaced placement of header connectors.

As shown in FIGURES 1 and 2, the base portion 15 contains a plurality of similarly shaped like recesses 17 and 17′, the walls of which are formed to provide individual openings 18 and 18′ in the juncture surface 19 of the base portion, while the oppositely disposed recess end walls 20 have dimensionally restricted perforations 21 therethrough. Female electrical contact members 23, being substantially of one-piece construction as of gold plated brass material, are integrally formed to seat within the above-described recesses. By a staking procedure the connection tails 25 and 25′ are projected into and through the perforations 21 in the recess end walls 20 whereupon a staking boss 26 is formed on the tail portion to effect individual securement. At least two shaped resilient conjunctively disposed contact prongs 24 are oriented adjacent the outer opening 18 and 18′ of each recess 17 and 17′. While female type contact members are shown and described, it is clearly evident that male type contacts could be utilized.

While not shown, one or more open-pocket or spacing recesses can be included in the base portion 15 should the requirements of the assembly holder structure so dictate.

The base portion 15, head portion 27, and the two end support members 29 and 30 are integrated into the frame-like assembly holder 13 forming therein a bounded spatial opening 37. The connection tails 25 and 25′ protruding from the first members 15 extend into the spatial opening 37. The oppositely disposed longitudinal head portion 27 has spacedly oriented therein a plurality of individual electrical connectors 31 having integral connective tabs 33 extending into the spatial opening 37 in spaced relationship with the oppositely positioned connection tails 25 and 25′ to facilitate the selective bridging of electronic components, thereacross. Within the central spatial opening 37 are positioned illustrative componental parts 41, 43, 45, 47, and 49 with no intent to delineate any particular circuitry. As previously mentioned, these may include such items as solid state devices, electron tubes, capacitors, resistive elements or common connective circuitry. For purposes of clarity, only several of such parts are shown in FIGURE 1 but, the versatility of connective combinations for specific circuit requirements is clearly evidenced. It will be noted that the depth of the frame-like holder 13 is sufficient to afford protection to the components oriented within the spatial opening. The spatial opening 37, in addition to providing space for the positioning of components also facilitates ventilation for the components. Such openings are particularly advantageous when a plurality of like assembly packages are positioned in side-by-side relationship as the line-up of openings provides ventilative flow therethrough.

The connectors 31 have additional connective means in the form of integral conductive tongues 35 extending exteriorly from the head portion to effect a plurality of male connective means to thereby facilitate the stacking of a compatible component assembly package thereupon.

Details of the individual connectors 31, which are of metal such as nickel-silver alloy, are shown in FIGURE 3 wherein the connectors are in spaced relationship in the form of an insert strip 55. The ambi-positional ends 59, which may be subsequently utilized as either connective tabs 33 or conductive tongues 35, are defined by transverse score lines 63 and 63′. Substantially in the center of each connector 31 there is formed a boss or dimple 65 which provides securement for each connector when the strip 55 is molded into the head portion 27. Upon completion of the molding operation, the edge portions 69 and 69′ of the insert 55 are broken away at the score lines 63 and 63′ to provide a plurality of individual connectors 31 spacedly molded into the head portion.

While the tabs 33, tongues 35, and tails 25 and 25′ are shown and described as being substantially of flat-formation, they can be of different terminal shapes and configurations adaptable to wire wrapping, crimping, and other pressure type jointures not shown.

Thus, in keeping with the embodiment described and logical combinations and variations thereof, there is provided an improved and adaptable electronic component assembly package that promotes facile installation and replacement in circuit applications. The compact frame-like assembly has sufficient frame width to afford protection to the components and circuitry contained within the unit. The spatial opening resulting from the frame-type construction facilitates ventilative characteristics for the assembly. In addition, the inherent constructive principles promotes inexpensive and expeditious fabrication of a rigid and dimensionally stable integrated component package.

While there has been shown and described what is at present considered the preferred embodiment of the invention, it will be obvious to those skilled in the art that various changes and modifications may be made therein without departing from the invention as defined by the appended claims.

What is claimed is:

1. A one-piece molded plastic frame-like component assembly holder of nonconductive high impact strength material with integrated provisions therein for accommodating a plurality of electrical components in a circuit package arrangement having electrical connectors adapted for mating with external connective means to permit facile insertion and removal juncture with external circuitry, said assembly holder comprising:

an insulative base portion of substantially longitudinal shape having an external juncture surface;

said base portion having therein a plurality of separate spaced recesses opening on said juncture surface, the inner surface of said base portion, opposite the juncture surface, having reduced area perforations communicating with said recesses;

an insulative head portion spaced from said base portion and oriented substantially in parallel relationship with said base portion;

a plurality of insulative end support members molded of a material like that of said base and head portions and integrally joined thereto to form said one-piece frame-like structure having at least one bounded spatial opening therein, wherein all of said electrical components and connections of said circuit arrangement may be accommodated, said structure having a frame width sufficient to provide protection to said components contained therein;

a plurality of electrical contact members formed to mate with external electrical connections and shaped for individual recessed inclusion within said base portion recesses, each contact member having a connection tail extending through an associated perforation in the inner surface of the base portion into said spatial opening to provide means for component attachment; and plural electrical connective means embedded in said head portion, arranged in a substantially flat-formation, said connective means having a rigid conductive tongue protruding exteriorly of the holder at right angles thereto to provide external male connective means to facilitate the plug-in interconnection of a stacked array of compatible assembly holders, said conductive tongues being the only projections extending exteriorly of said holder and said connective means also having a plurality of connective tabs protruding interiorly therefrom into said spatial opening in substantially spaced relationship with said connection tails to provide means for interconnection and component attachment and facilitate the bridging of said electrical component means thereacross thereby providing a package of integrated circuitry protected by the insulative frame-like structure of said assembly holder and having readily accessible terminals incorporated therein adapted for facile mating attachment to external circuitry.

2. A one-piece molded plastic frame-like component assembly holder according to claim 1 wherein the contact members in the recesses in said base portion are female electrical contact members each having means formed thereon to effect individual securement within said recesses.

References Cited

UNITED STATES PATENTS

| | | | |
|---|---|---|---|
| 2,664,552 | 12/1953 | Ericsson et al. | 339—192 |
| 2,754,454 | 7/1956 | McNutt et al. | 317—101 |
| 2,821,669 | 1/1958 | Christian | 317—101 |
| 2,879,492 | 3/1959 | Kikta | 317—101 X |
| 3,054,024 | 9/1962 | VanDillen et al. | 317—101 |

FOREIGN PATENTS

| | | |
|---|---|---|
| 1,169,681 | 9/1958 | France. |

ROBERT K. SCHAEFER, *Primary Examiner.*

R. S. MACON, *Examiner.*

W. C. GARVERT, *Assistant Examiner.*